United States Patent
Shiah et al.

(10) Patent No.: US 7,609,579 B2
(45) Date of Patent: Oct. 27, 2009

(54) MEMORY MODULE WITH FAILED MEMORY CELL REPAIR FUNCTION AND METHOD THEREOF

(75) Inventors: Chun Shiah, Hsinchu (TW); Tzu Jen Ting, Hsinchu (TW); Ho-Yin Chen, Hsinchu (TW)

(73) Assignee: Etron Technology Inc., Hsinchu (TW)

( * ) Notice: Subject to any disclaimer, the term of this patent is extended or adjusted under 35 U.S.C. 154(b) by 145 days.

(21) Appl. No.: 11/984,707

(22) Filed: Nov. 21, 2007

(65) Prior Publication Data

US 2009/0129182 A1 May 21, 2009

(51) Int. Cl.
*G11C 17/18* (2006.01)
(52) U.S. Cl. .............. 365/225.7; 365/210; 365/200
(58) Field of Classification Search ........... 365/225.7, 365/210, 200, 222, 203, 189.09, 191, 96, 365/195.14
See application file for complete search history.

(56) References Cited

U.S. PATENT DOCUMENTS 5,931,962 A * 8/1999 Dang .................. 714/731

2005/0099868 A1 * 5/2005 Oh ...................... 365/222

* cited by examiner

Primary Examiner—Dang T Nguyen
(74) Attorney, Agent, or Firm—Rosenberg, Klein & Lee

(57) ABSTRACT

A memory module with failed memory cell repair function and method thereof are provided. The memory module comprises a programming interface, a mode register, a control signal generator, a fuse unit, a main memory array and a redundant memory array, wherein the programming interface is defined by selecting pins from a standard interface of the memory module. The programming interface is used to input a plurality of programming commands and a plurality of programming data. When the failed memory cells have occurred within the main memory array, the mode register will enter into a programming mode according to the programming commands, and the control signal generator will program the fuse unit, such that the redundant memory cells of the redundant memory array will be used to replace the failed memory cells. Thus, the fuse unit can be programmed directly through the standard interface, and the repairing period and the cost will be reduced efficiently.

16 Claims, 4 Drawing Sheets

MEMORY MODULE WITH FAILED MEMORY CELL REPAIR FUNCTION AND METHOD THEREOF

FIELD OF THE INVENTION

The present invention relates to a memory module, more particularly to a memory module with failed memory cell repair function and method thereof.

BACKGROUND OF THE INVENTION

The memory device is getting more complex in nowadays due to the capacity thereof is demanded to be larger, such that the packaging process of which becomes more and more difficult correspondingly. Accordingly, more failed memory cells will be occurred due to the integration thereof is higher during the fabricating process. Therefore, more capacity of the memory device, higher integration of memory cells will be, proportionally, more failed memory cells will be occurred, and further, the yield of memory device will be affected certainly.

Generally, a redundant memory array is used to improve the yield. The redundant memory array consists of redundant memory cells, which is provided around the main memory array for being used to replace the failed memory cells while the failed memory cells have occurred. Therefore, the yield can be improved efficiently since the redundant memory array is applied during the fabricating process.

In detail, the individual redundant memory array is respectively connected to the corresponding bit line and the corresponding word line of the main memory array through a fuse. Thus, when a failed memory cell is occurred and going to be repaired, the corresponding fuse will be blown by a laser light beam or a high voltage to be as the open state. Equally, replacing the failed memory cell by the redundant memory cell is according to the blowout fuse. Oppositely, if there is nothing required for being repaired, then the fuse is still remaining to be the close state. Therefore, the fuse is capable of being programmed regarding to the address within the main memory array can be repaired while the failed memory cells have occurred.

Due to the fuse can be blown by the laser light beam, the laser machine has to be used; however, which is inconvenient for moving while the failed memory cells is repairing. Furthermore, the repairing period is too long, and the cost thereof will be increase. Additionally, while the memory device has packaged, the failed memory cells cannot be further repaired since that are found thereafter.

SUMMARY OF THE INVENTION

The primary object of the present invention is to provide a memory module with failed memory cell repair function, wherein the memory module can directly program the fuse unit through the programming interface, such that the failed memory cells can be repaired no matter when that is found, even finishing package process.

The secondary object of the present invention is to provide a memory module with failed memory cell repair function and method thereof, wherein the programming interface of the standard interface can be used for repairing the failed memory cells, such that the repairing period and the cost can be reduced efficiently, accordingly, the repairing process will be more convenient.

The another object of the present invention is to provide a memory module with failed memory cell repair function and method thereof, wherein a programming mode is built within a mode register, so that the memory module can enter into one of a programming mode and a standard mode according to a programming commands.

To achieve the previous mentioned objects, the present invention provides a memory module with failed memory cell repair function, comprising: a programming interface comprising a plurality of pins selected from a standard interface of said memory module, and used to input a plurality of programming commands and a plurality of programming data; a mode register connected to said standard interface for receiving said programming commands, and said memory module entering into to one of a programming mode and a standard mode according to said programming commands; a control signal generator connected to said standard interface and said mode register for receiving said programming commands and said programming data; a fuse unit connected to said control signal generator; a main memory array comprising a plurality of main memory cells, connected to said control signal generator; and a redundant memory array comprising a plurality of redundant memory cells, connected to said fuse unit and said control signal generator for replacing the failed memory cells of said main memory array according to said fuse unit; wherein said control signal generator programs said fuse unit according to said programming commands and said programming data when said memory module is in said programming mode.

To achieve the previous mentioned objects, the present invention further provides a repair method for repairing the failed memory cell, comprising the steps of: defining a programming interface which comprises a plurality of pins selected from a standard interface of said memory module; entering a programming mode according to a first programming command from said programming interface; latching at least a programming data from said programming interface, pulling up a operating voltage, and programming a fuse unit according to said programming data and a second programming command from said programming interface; recovering said operating voltage and stopping programming said fuse unit according to a third programming command from said programming interface; and exiting said programming mode according to a fourth programming command from said programming interface.

DETAILED DESCRIPTION OF THE INVENTION

Figure 1:
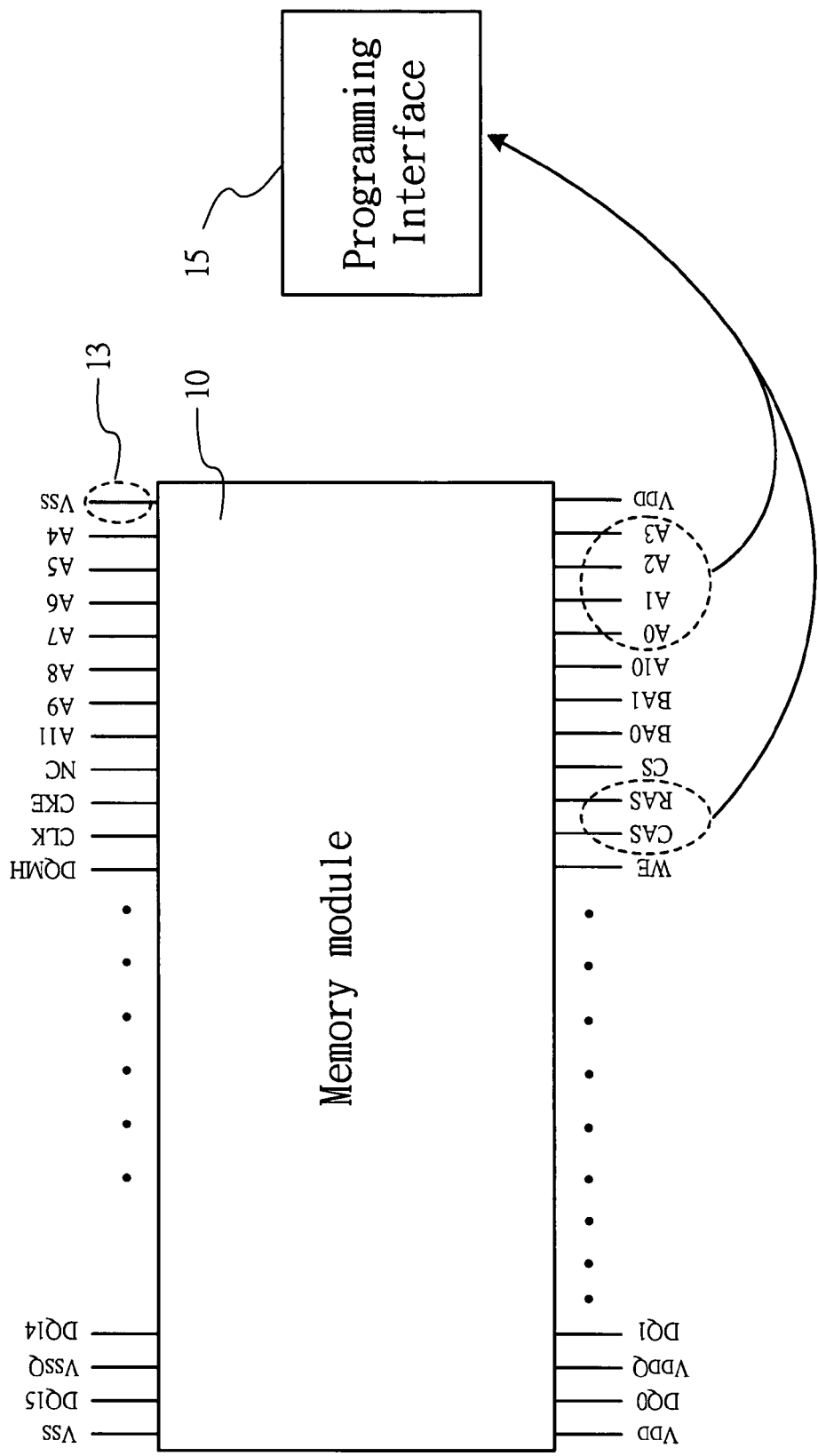
FIG. 1 is a diagram of preferred embodiment of the present invention regarding to a memory module with the programming interface.

Reference to FIG. 1, a diagram of a preferred embodiment of the present invention regarding to a memory module with the programming interface is disclosed. The memory module 10 comprises a plurality of pins being as the standard interface 13 thereof, wherein some of pins are selected to be as a programming interface 15, such as: CAS, RAS, A0, A1, A2 and A3. And, the memory module 10 can be going to repair the memory cell through the programming interface 15 of the standard interface 13. In this case, the programming interface 15 is merely one embodiment of present invention according to the selected pins.

Figure 2:
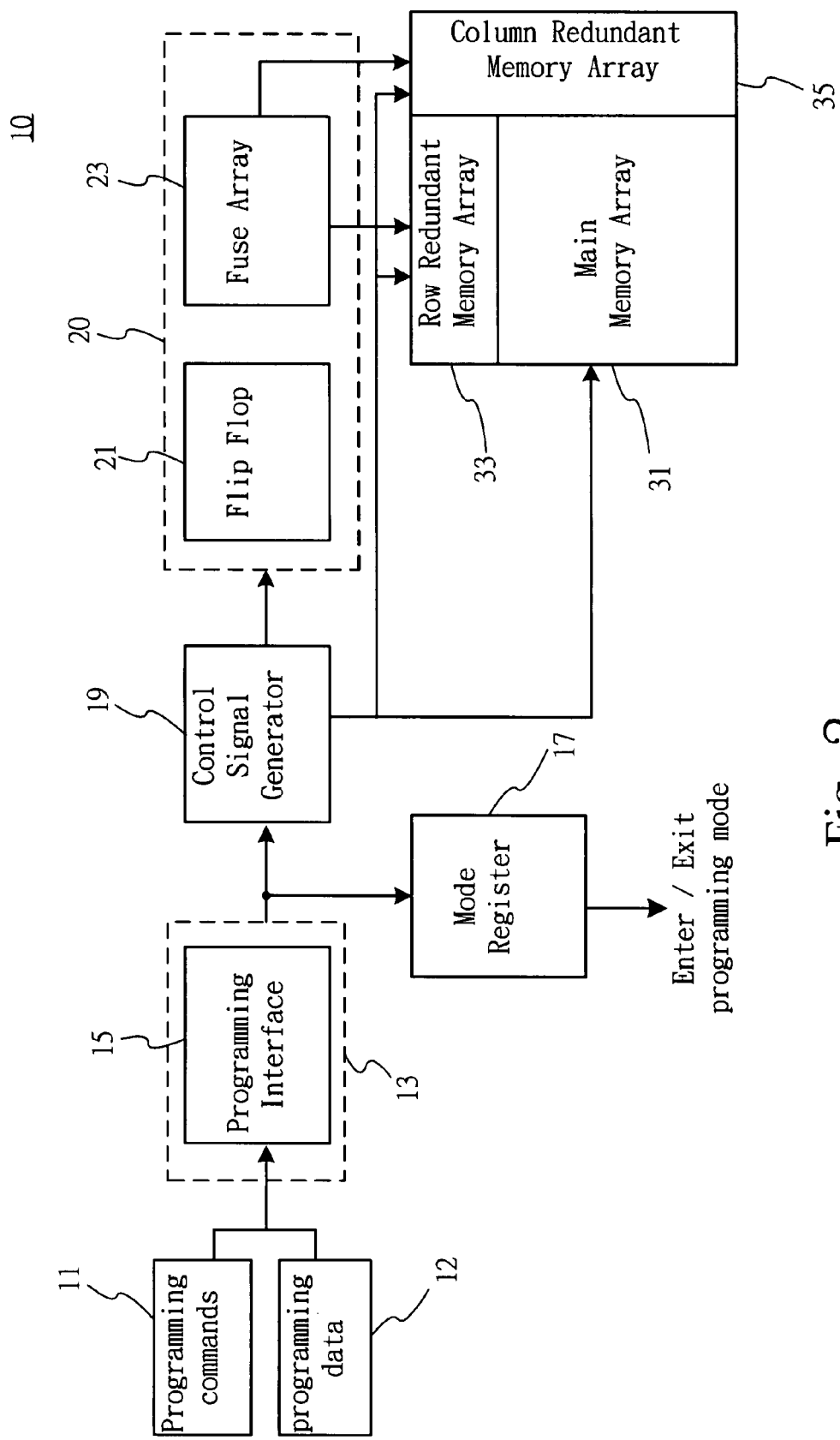
FIG. 2 is a circuit structure diagram of preferred embodiment of the present invention.

Reference to FIG. 2, a circuit structure diagram of the preferred embodiment of the present invention is disclosed. The memory module 10 comprises a programming interface 15, a mode register 17, a control signal generator 19, a fuse unit 20, a main memory array 31 and a redundant memory array.

The programming interface 15 is used to input a plurality of programming commands 11 and a plurality of programming data 12, wherein the programming data 12 comprises the repair address information indicating the addresses of the failed memory cells within the main memory array 31. The mode register 17 is used for recording and issuing the state mode of the memory module 10, and connected to the standard interface 13 for receiving the programming commands 11, wherein the programming commands indicate that whether a standard mode or a programming mode is determined.

The control signal generator 19 is connected with the standard interface 13 and the mode register 17 for receiving the programming commands 11 and the programming data 12. When the memory module 10 is in the programming mode according to the mode register 17, the control signal generator 19 is going to proceed the repair process for the memory module according to the programming commands 11 and the programming data 12.

The fuse unit 20 is connected to the control signal generator 19. The fuse unit 20 comprises a flip-flop 21 and a fuse array 23. The fuse array 23 consists of a plurality of fuse cells, and the fuse array 23 is a nonvolatile memory. The flip-flop 21 is used for latching the programming data 12 that is inputted from the programming interface 15.

In addition, the main memory array 31 comprises a plurality of main memory cells, and the redundant memory array comprises a row redundant memory array 33 and a column memory array 35, which are respectively having a plurality of redundant memory cells. The main memory array 31, the row redundant memory array 33, and the column redundant memory array 35 are respectively connected to the control signal generator 19 and the fuse unit 20.

If the failed memory cell is found within the main memory array 31 after the reliability experiment of product, the mode register 17 will receive the programming commands 11 from the programming interface 15, wherein the programming commands indicate to issue the memory module 10 entering into the programming mode, so that the memory module 10 will be operated in the programming mode.

At the moment, the control signal generator 19 will receive the programming data 12 according the programming commands 11, and then transmit the programming data 12 to the flip-flop 21, wherein the flip-flop 21 will latch the programming data 12. Besides, the control signal generator 19 will pull up an operating voltage to the desired value during the programming mode period, such that a high voltage will be provided to program each fuse cells of the fuse array 23 according to the repair address information of the programming data 12.

After the individual fuse cells are programmed according to the repair address information, the corresponding row redundant memory cells of the row redundant memory array 33 and the corresponding column redundant memory cells of the row redundant memory array 35 are tuned according to the programmed fuse cells of the fuse array 23, such that the corresponding row redundant memory cells and the corresponding column redundant memory cells will be connected with the failed memory cells in rows and columns of the main memory array 31 respectively, and the failed memory cells will be replaced. Thus, the memory module 10 will be a non-failure memory module conclusively.

Oppositely, after the reliability experiment for the product, the memory module 10 is without any failed memory cell in the main memory array 31. The mode register 17 will receive the programming commands 11 from the programming interface 15, wherein the programming commands indicate to issue the memory module 10 entering into the standard mode. Moreover, the control signal generator 19 will not receive the programming commands 11 and the programming data 12, such that the fuse unit 20 is without programming and the redundant memory array is in the turned off state. Besides, the memory module 10 can be access the main memory array normally.

Figure 3:
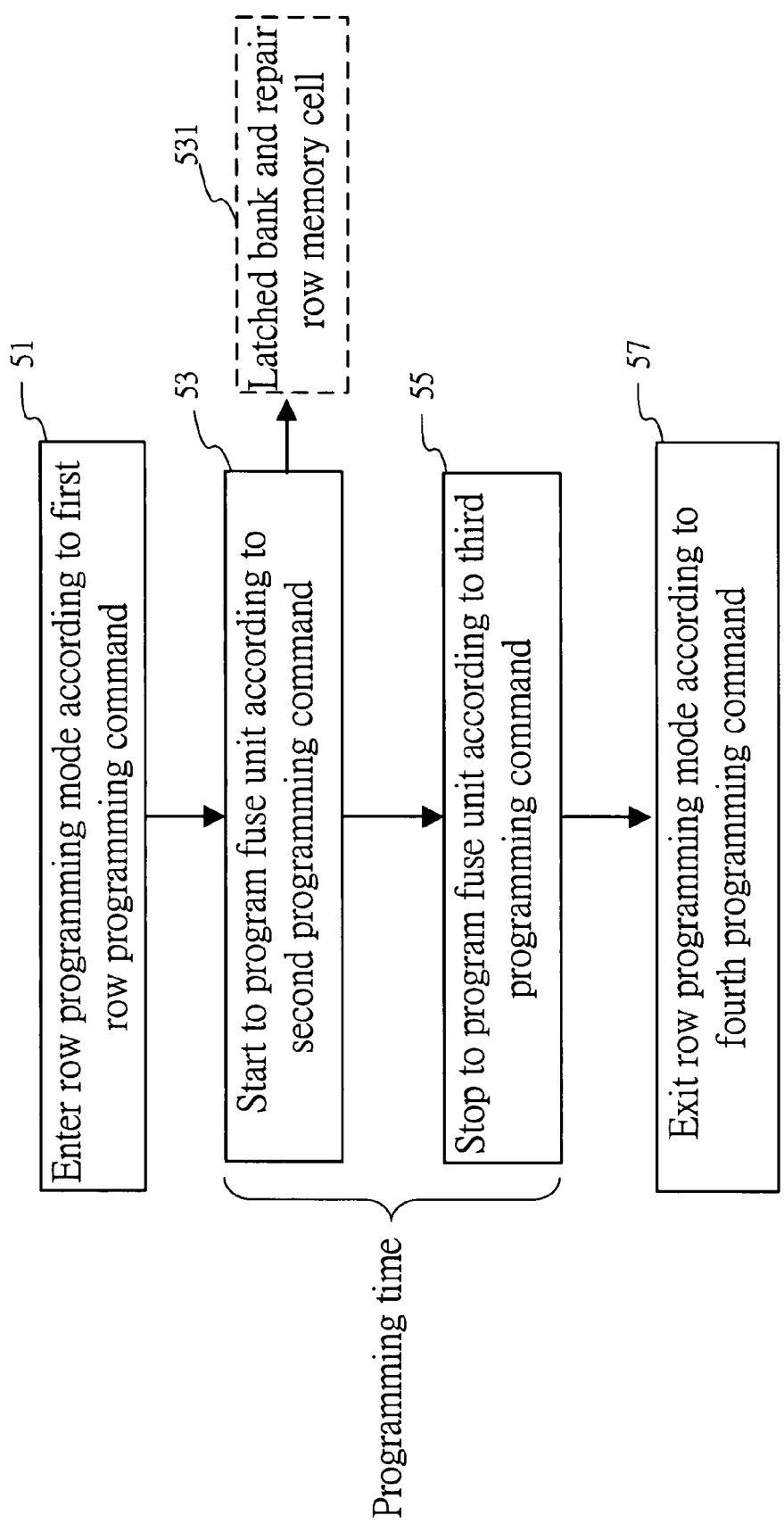
FIG. 3 is a flowchart of preferred embodiment of the present invention.

Reference to FIG. 3, a flowchart of the preferred embodiment of the present invention is disclosed. The method of repairing the row memory cells is described as the following steps: defining a programming interface 15 which comprises a plurality of pins selected from a standard interface 13 of the memory module 10; inputting a plurality of programming commands 11 continuously to the memory module 10 through the programming interface 15.

First, a first row programming command inputs to the memory module 10 through the programming interface 15, a mode register 17 will receive the first row programming command to record and issue the memory module 10 entering into the row programming mode, as shown in step 51.

When the memory module 10 is in the row programming mode, a second programming command will be inputted through the programming interface 15, thereafter, a control signal generator 19 will receive the second programming command for going to program the fuse unit 20, as shown in the step 53.

Simultaneously, the control signal generator 19 will receive a plurality of programming data 12 which inputs through the programming interface 15 and indicates the repair address information, and transmits the programming data 12 to the flip-flop 21 of the fuse unit 20, wherein the flip-flop 21 will latch the programming data 12. Besides, the control signal generator 19 pulls up a operating voltage to the desired value during the row programming mode, so as to provide a high voltage to program each fuse cells of the fuse array 23 according to the repair address information. Thus, the individual fuse cells of the fuse array 23 will be programming finished by the control signal generator 19. Then, the corresponding row redundant memory cells of the row redundant memory array 33 are tuned on according to the programmed fuse cells, such that the corresponding row redundant memory cells will be connected with the failed row memory cells, and that replace the failed row memory cells, as shown in the step 531.

When the whole failed row memory cells are repaired complete according to the programming data 12, a third programming command will be inputted through the programming interface 15. The control signal generator 19 receives the third programming command from the programming interface 15 to recover the operating voltage to the normal value, and stops programming the fuse unit 20, as shown in the step 55.

When the operating voltage recovers to the normal value, a fourth programming command will be inputted through the programming interface 15. Moreover, the mode register 17 will receive the fourth programming command from the programming interface 15, wherein the programming command indicates to issue the memory module 10 exiting the row programming mode, and returning to the standard mode, as shown in the step 57.

Figure 4:
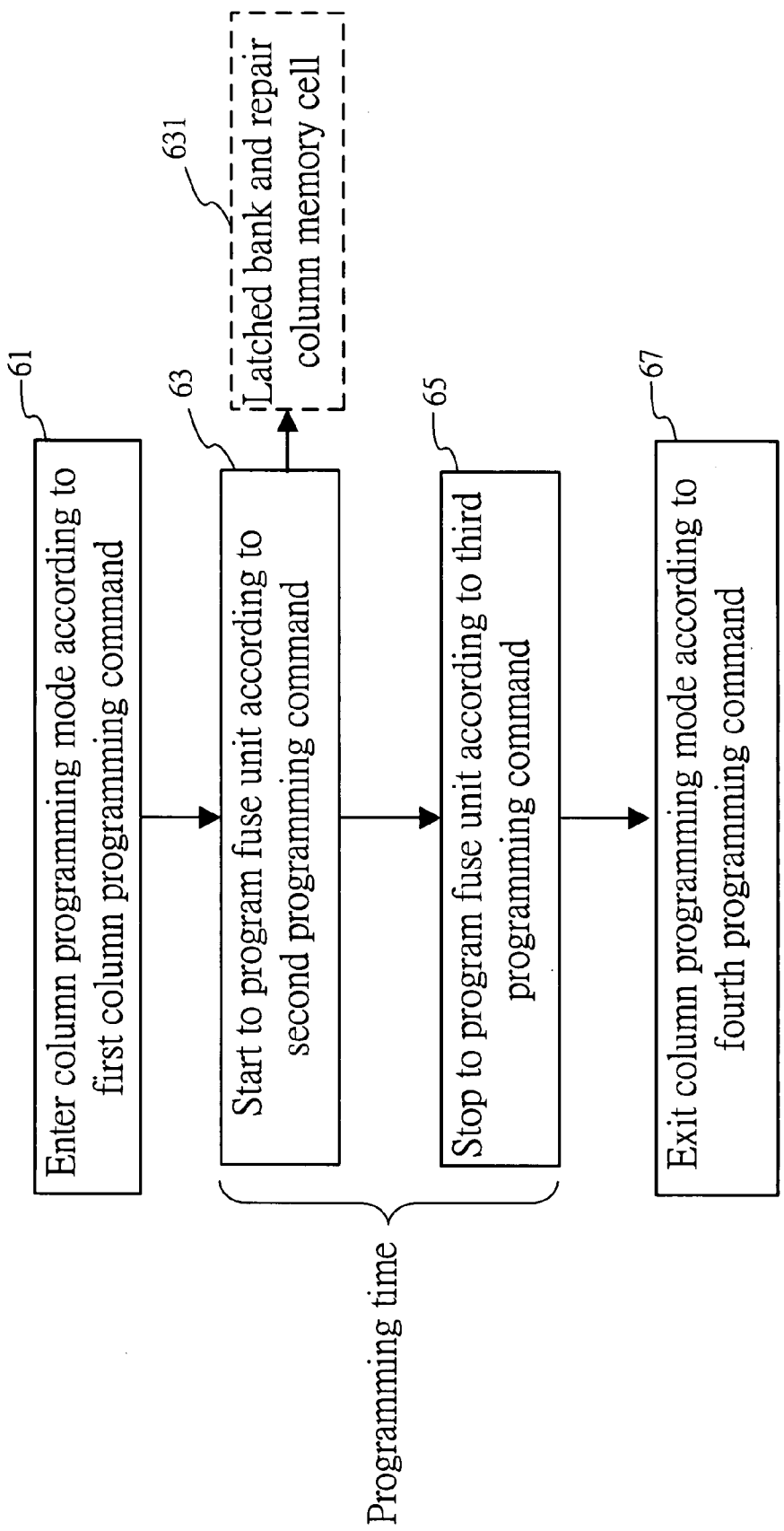
FIG. 4 is another flowchart of preferred embodiment of the present invention.

Reference to FIG. 4, another flowchart of the preferred embodiment of the present invention is disclosed. The method of repairing the column memory cell is described as the following steps: defining a programming interface 15 which comprises a plurality of pins selected from a standard interface 13 of the memory module 10; inputting a plurality of programming commands 11 continuously to the memory module 10 through the programming interface 15.

When a first column programming command is inputted to the memory module 10 through the programming interface 15, a mode register 17 will receive the first column programming command and record, wherein the first column programming command indicates to issue the memory module 10 entering into the column programming mode, as shown in step 61.

When the memory module 10 is in the column programming mode, a second programming command will be inputted through the programming interface 15, thereafter, the control signal generator 19 will receive the second programming command for going to program the fuse unit 20 according to the second programming command, as shown in the step 63.

Simultaneously, the control signal generator 19 will receive a plurality of programming data 12 that is inputted through the programming interface 15 indicates the repair address information, and further transmit the programming data 12 to the flip-flop 21 of the fuse unit 20, wherein the flip-flop will latch the programming data 12. Besides, the control signal generator 19 will pull up an operating voltage to the desired value during the column programming mode, such that a high voltage is provided to program each fuse cells of the fuse array 23 according to the repair address information. Thus, the individual fuse cells of the fuse array 23 will be programming and stopped by the control signal generator 19. Then, the corresponding column redundant memory cells of the column redundant memory array 33 are tuned according to the programmed fuse cells, such that the corresponding column redundant memory cells will be connected with the failed column memory cells, and further, the failed column memory cells will be replaced, as shown in the step 631.

When the whole failed column memory cells are repaired completely according to the programming data 12, a third programming command will be inputted through the programming interface 15. The control signal generator 19 receives the third programming command from the programming interface 15 to recover the operating voltage to the normal value, and stops programming the fuse unit 20, as shown in the step 65. Finally, when the operating voltage recovers to the normal value, a fourth programming command will be inputted through the programming interface 15. Moreover, the mode register 17 will receive the fourth programming command from the programming interface 15, wherein the fourth programming command indicates to issue the memory module 10 exiting the column programming mode, and returning to the standard mode, as shown in the step 67.

The failed memory cells can be repaired through the programming interface 15 that is with advantages, including that the memory module can directly to program the fuse through the programming interface; the repairing period and the cost can be reduced since that is without the laser machine. Furthermore, the failed memory cell can still be repaired no matter when that is found, even finishing package process.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A memory module with failed memory cell repair function, comprising:
    a programming interface comprising a plurality of pins selected from a standard interface of said memory module, and used to input a plurality of programming commands and a plurality of programming data;
    a mode register connected to said standard interface for receiving said programming commands, and said memory module entering into one of a programming mode and a standard mode according to said programming commands;
    a control signal generator connected to said standard interface and said mode register for receiving said programming commands and said programming data;
    a fuse unit connected to said control signal generator;
    a main memory array comprising a plurality of main memory cells, connected to said control signal generator; and
    a redundant memory array comprising a plurality of redundant memory cells, connected to said fuse unit and said control signal generator for replacing the failed memory cells of said main memory array according to said fuse unit; wherein said control signal generator programs said fuse unit according to said programming commands and said programming data when said memory module is in said programming mode.

2. The memory module of claim 1, wherein said fuse unit comprises:
    a flip flop connected to said control signal generator; and
    a fuse array comprising a plurality of fuse cells, connected to said flip flop and said control signal generator.

3. The memory module of claim 2, wherein said fuse array is a nonvolatile memory.

4. The memory module of claim 1, wherein said redundant memory array comprises a row redundant memory array and a column redundant memory array.

5. The memory module of claim 1, wherein said programming commands comprises a plurality of row programming commands and a plurality of column programming commands.

6. The memory module of claim 1, wherein said programming data comprises a plurality of row programming data a plurality of column programming data.

7. The memory module of claim 1, wherein said programming mode further comprises a row programming mode and a column programming mode.

8. The memory module of claim 1, wherein said memory module is selected from one of a dynamic random access memory module and a synchronous dynamic random access memory.

9. A method for repairing the failed memory cell, comprising the steps of:
    defining a programming interface which comprises a plurality of pins selected from a standard interface of said memory module;
    entering a programming mode according to a first programming command from said programming interface;
    latching at least a programming data from said programming interface, pulling up a working voltage, and programming a fuse unit according to said programming data and a second programming command from said programming interface;

recovering said working voltage and stopping programming said fuse unit according to a third programming command from said programming interface; and exiting said programming mode according to a fourth programming command from said programming interface.

10. The repair method of claim 9, wherein said fuse unit comprises a flip-flop and a fuse array.

11. The repair method of claim 10, wherein said flip-flop is used for latching said programming data.

12. The repair method of claim 10, wherein said fuse array is a nonvolatile memory.

13. The repair method of claim 9, wherein said programming mode is a row programming mode for row memory cell repair.

14. The repair method of claim 9, wherein said programming mode is a column programming mode for column memory cell repair.

15. The repair method of claim 13, wherein said first programming command comprises a first row programming command and said programming data comprises at least a row programming data.

16. The repair method of claim 14, wherein said first programming command comprises a first column programming command and said programming data comprises at least a column programming data.

* * * * *